United States Patent [19]

Burnstein et al.

[11] 4,230,383

[45] Oct. 28, 1980

[54] INTEGRAL CONTACT

[75] Inventors: Philip J. Burnstein, Skokie; George R. Pariza, Batavia; Stephen L. Siegel, Hanover Park, all of Ill.

[73] Assignee: Pittway Corporation, Aurora, Ill.

[21] Appl. No.: 959,337

[22] Filed: Nov. 9, 1978

[51] Int. Cl.[3] .......................... H05K 1/18; H01R 4/28

[52] U.S. Cl. .............................. 339/17 R; 339/220 R; 339/221 R; 339/258 R

[58] Field of Search ............. 339/220 R, 93 R, 220 T, 339/221 R, 17 CF, 258 R, 217 S, 221 M, 17 LM, 17 M, 275 B, 193 P, 17 R

[56] References Cited

U.S. PATENT DOCUMENTS

| | | | |
|---|---|---|---|
| 2,004,610 | 6/1935 | Jones | 339/93 R |
| 2,814,024 | 11/1957 | Narozny | 339/220 R X |
| 3,404,243 | 10/1968 | Krieger et al. | 179/110 |
| 3,440,363 | 4/1969 | Boll | 179/121 |
| 3,479,634 | 11/1969 | Pritulsky | 339/275 B X |
| 3,617,989 | 11/1971 | Heath | 339/217 X |
| 3,808,589 | 4/1974 | Bonhomme | 339/258 R X |
| 3,815,129 | 6/1974 | Sweany | 340/388 |
| 3,879,726 | 4/1975 | Sweany | 340/384 E |
| 4,017,143 | 4/1977 | Knowles | 339/221 R |
| 4,050,755 | 9/1977 | Hasircoglu | 339/17 CF |
| 4,052,118 | 10/1977 | Scheingold | 339/17 CF |
| 4,060,296 | 11/1977 | Kunkle | 339/17 CF |
| 4,080,032 | 3/1978 | Cherian | 339/17 CF X |
| 4,129,351 | 12/1978 | Sugimoto | 339/17 LM X |

FOREIGN PATENT DOCUMENTS

| | | | |
|---|---|---|---|
| 1013421 | 12/1965 | United Kingdom | 339/17 LM |

*Primary Examiner*—John McQuade
*Assistant Examiner*—John S. Brown
*Attorney, Agent, or Firm*—Vogel, Dithmar, Stotland, Stratman & Levy

[57] ABSTRACT

The contact connects a circuit element (such as a piezoelectric transducer) to a circuit (such as an oscillator which drives the transducer). The contact comprises a body, an ear which is mechanically and electrically connected to the circuit, and a pair of bifurcated fingers which springingly electrically engage the circuit element. Several such contacts may be used to connect different portions of the circuit to corresponding portions of the circuit element.

15 Claims, 11 Drawing Figures

INTEGRAL CONTACT

BACKGROUND OF THE INVENTION

In order to connect a circuit element to its associated circuit, solder is usually used because it provides a good electrical and mechanical interconnection. In certain instances, however, it is desirable that solder not be used on the circuit element so as to minimize the effect of the connection on performance of the element and also to reduce the expense of making the connection.

Such factors are relevant to the manufacture of smoke detectors incorporating piezoelectric horns. In recent years piezoelectric material has become more and more widely used in transducers to convert electrical signals into sound and vice versa. Such a transducer may be used in a smoke detector which produces an alerting signal in the presence of smoke. Very basically, such as smoke detector includes smoke-sensing means and a piezoelectric horn, which horn, in turn, has an oscillator and a piezoelectric transducer. The piezoelectric transducer, excited by electrical signals from the oscillator, produces vibrations at a particular audio frequency which constitutes an alerting tone.

In currently available piezoelectric horns, the piezoelectric transducer is electrically connected to the oscillator circuit by means of wires soldered directly to the transducer. It has been found that these soldered connections have an undesirable effect on the efficiency of the transducer itself, i.e. its audio output for a given input. Also, a soldered connection is time consuming to make, thereby adding to the cost of manufacturing the transducer. Moreover, such soldering tends to vaporize the silver electrodes which are commonly used on piezoelectric transducers.

SUMMARY OF THE INVENTION

It is therefore an important object of the present invention to provide a contact which interconnects a circuit element to a circuit without the use of solder on the element.

Another object is to enable faster assembly of a piezoelectric transducer to its associated circuit.

Another object is to minimize the effect of the connection on the response characteristics of a piezoelectric transducer.

A further object is to improve the efficiency of a piezoelectric transducer, that is to say, improve its audio output for a given battery supply.

A further object is to preclude damage to the electrodes on the piezoelectric transducer when it is connected in a circuit.

In summary, there is provided an integral contact for providing electrical connection between a circuit and a circuit element all adapted to be mounted in a housing, the contact comprising a body mountable in the housing, an ear on the body for electrical and mechanical connection to the circuit, and bifurcated fingers carried by the body for springingly electrically engaging the circuit element.

The invention consists of certain novel features and a combination of parts hereinafter fully described, illustrated in the accompanying drawings, and particularly pointed out in the appended claims, it being understood that various changes in the details may be made without departing from the spirit, or sacrificing any of the advantages, of the invention.

BRIEF DESCRIPTION OF THE DRAWINGS

For the purpose of facilitating an understanding of the invention, there is illustrated in the accompanying drawings, one preferred embodiment thereof, from an inspection of which, when considered in connection with the following description, the invention, its construction, and operation, and many of its advantages should be readily understood and appreciated.

DESCRIPTION OF THE PREFERRED EMBODIMENT

Figure 1:
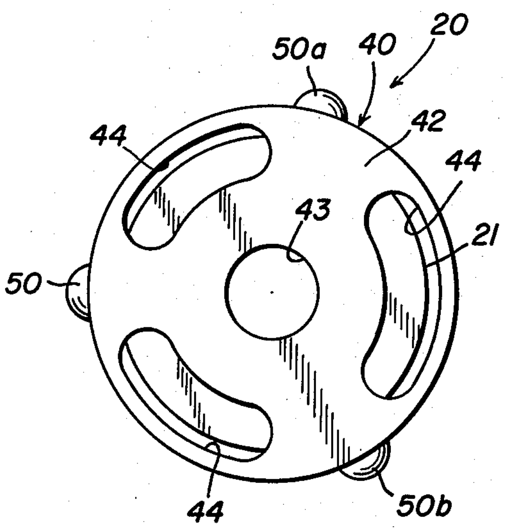
FIG. 1 is a plan view of one end of a piezoelectric horn incorporating the features of the present invention.
Figure 2:
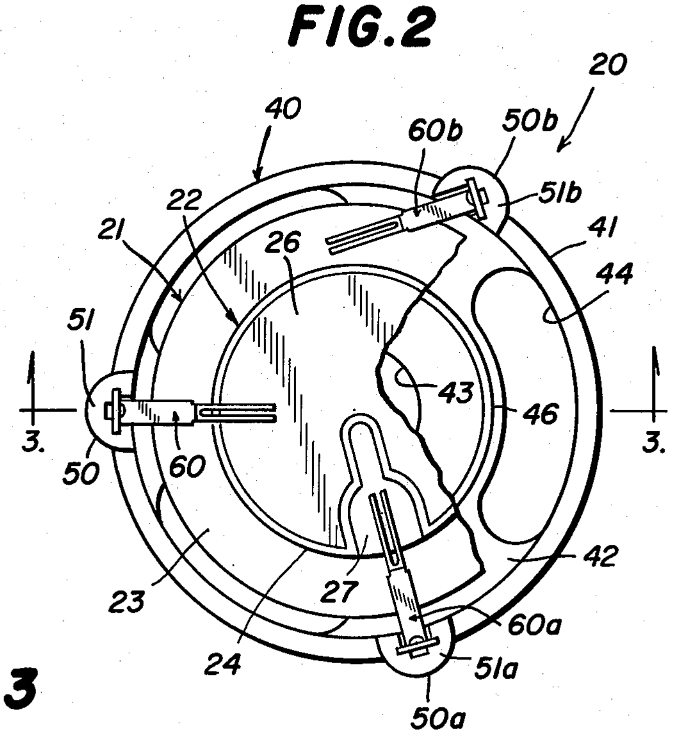
FIG. 2 is a plan view on an enlarged scale of the other end of the horn, with the printed circuit board carrying the electrical circuit having been removed and with a portion of the piezoelectric transducer having been cut away to expose other portions of the housing.
Figure 3:
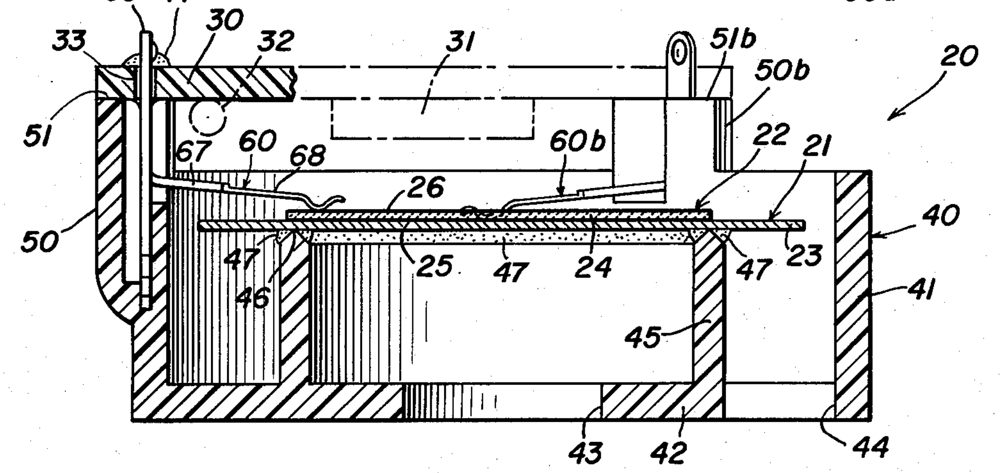
FIG. 3 is an enlarged view in vertical section along the line 3—3 of FIG. 2 but with the printed circuit board and associated circuit elements partly shown in phantom and partly shown in vertical section.

Turning now to the drawings and more particularly to FIGS. 1-3 thereof, there is shown a piezoelectric horn 20 incorporating the features of the present invention. The horn 20 includes a piezoelectric transducer 21 which is electrically connected to a circuit mounted on a printed circuit board 30. Direct current power is supplied by a battery (not shown) connected electrically to the circuit on the board 30. The circuit in conjunction with the transducer 21 oscillates at an audio frequency. The transducer 21 converts these electrical oscillations to mechanical vibrations so as to produce a loud tone. In a smoke detector, the piezoelectric horn 20 is activated in the presence of smoke to produce an alerting tone which warns of the occurrence of smoke. Such a horn is useful in numerous other applications in which it is desirable to produce an alerting tone. Furthermore, piezoelectric horn is simply an exemplary environment for the invention to be described and claimed hereafter.

Although the piezoelectric horn does not per se form part of the present invention, its constructional details will facilitate an understanding of the features of the present invention. Referring to FIG. 2, the piezoelectric horn 21 includes a piezoelectric element 22 suitably bonded to a substrate 23. The piezoelectric element 22 includes a piezoelectric crystal 24 and three electrodes 25, 26 and 27. Both the piezoelectric element 22 and the substrate 23 are circular. The electrode 25 covers substantially the entirety of one side of the crystal 24, and the electrode 26 covers most of its other side. The third electrode 27 is on the same side as the electrode 26 and is electrically isolated therefrom, as shown in FIG. 2.

Each of the electrodes 25, 26 and 27 is a thin sheet or coating of electrically conductive material such as silver. The substrate 23 serves as the diaphragm for the transducer 21 and may be fabricated from a metal, such as brass.

The electrodes 25 and 26 provide the drive means for the piezoelectric transducer 21, while the electrode 27, which is much smaller in area than the electrode 25 and 26, constitutes a feedback means. Further details of the transducer 21 may be had by reference to U.S. Pat. No. 3,815,129 to Sweany.

it is to be understood that the particular transducer described above and described in greater detail in the referenced patent is merely exemplary and provides a convenient vehicle to describe the housing and the contacts which define the heart of the present invention. Such housing and contacts, it is to be understood, can be used with different types of piezoelectric transducers and for that matter different types of circuit elements.

The transducer 21 is driven by a circuit mounted on a printed circuit board 30. Such circuit is represented by an integrated circuit 31 and a capacitor 32. The printed circuit board 30 has three slits near its periphery, one of which is shown in FIG. 3, that is, a slit 33. To the circuit mounted on this printed circuit board 30 is connected a source of direct current such as a battery (not shown) which activates the circuit and the piezoelectric transducer 21 connected thereto. The substrate 23 is caused to vibrate at a frequency determined by the components on the printing circuit board 30, thereby producing an alerting tone.

The circuit element represented by the piezoelectric transducer 21 and the circuit represented by the printed circuit board 30 are mounted in a housing 40 which is of one-piece construction and is preferably molded from plastic. The housing 40 includes a cylindrical side wall 41 and an end wall 42. In the center of the end wall 42 is a central opening 43 through which sounds from the transducer 21 are emitted. Surrounding the central opening 43 is a set of three kidney-shaped peripheral openings 44 which prevent undesirable reverberations from occurring. The housing 40 also includes a cylindrical interior wall 45 terminating in a ledge 46, which ledge in the embodiment shown, is an annular knife edge. The ledge 46 supports the transducer 21 and is attached thereto by means of adhesive 47. The adhesive is preferably a silicone rubber which is flexible to minimize damping of the transducer 21.

The housing 40 further includes three bosses or shoulders 50, 50*a*, and 50*b* distributed about the periphery of the side wall 41 and respectively having surfaces 51, 51*a* and 51*b* which are coplanar and define a three-point support for the printed circuit board 30, as shown in FIG. 3.

Figure 4:
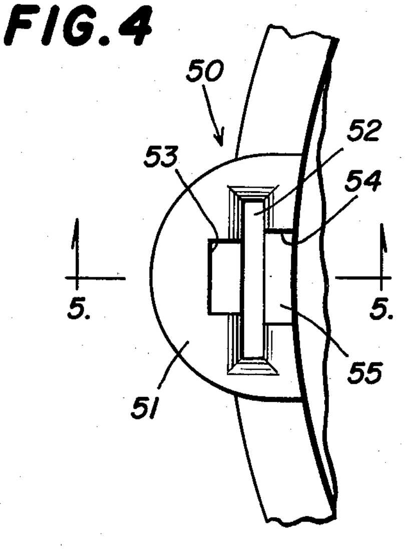
FIG. 4 is an enlarged plan view of one of the three shoulders which receives an integral contact.
Figure 5:
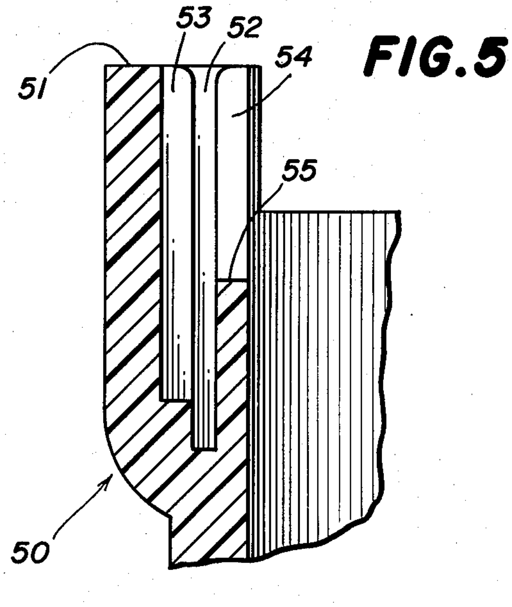
FIG. 5 is a view in vertical section on an enlarged scale taken along the line 5—5 of FIG. 4.

Referring to FIGS. 4 and 5, the shoulder 50 has therein a rectangular channel 52 extending generally parallel to the cylindrical axis of the cylindrical side wall 41. The housing 40 is preferably molded of one piece and the channel 52 is formed by a blade in the mold. Since the channel 52 is narrow, that blade would have a tendency to break. The blade has a thickened center portion to prevent such breakage, which creates a rectangular channel 53, which is outside of the channel 52 and is slightly smaller in height and breadth than the channel 52. On the inside of the channel 52 is a notch 54 which opens to the interior of the housing 40, the lower end of the notch 54 being defined by a stop surface 55.

The shoulder 50*a* has basically the same construction as the shoulder 50. The shoulder 50*b* also has the same elements but the plane of the channel therein is not perpendicular to a plane passing through the cylindrical axis of the side wall 41.

The piezoelectric horn further comprises a set of three integral contacts 60, 60*a* and 60*b* for electrically interconnecting the transducer 21 to the circuit on the printed circuit board 30.

Figure 6:
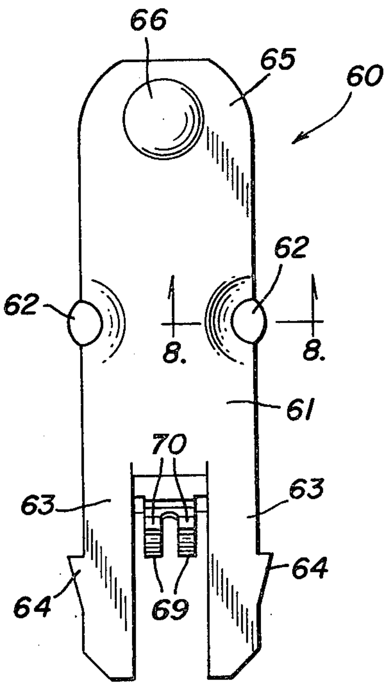
FIG. 6 is an elevation view of the integral contact which incorporates the features of the present invention.
Figures 7, 8:
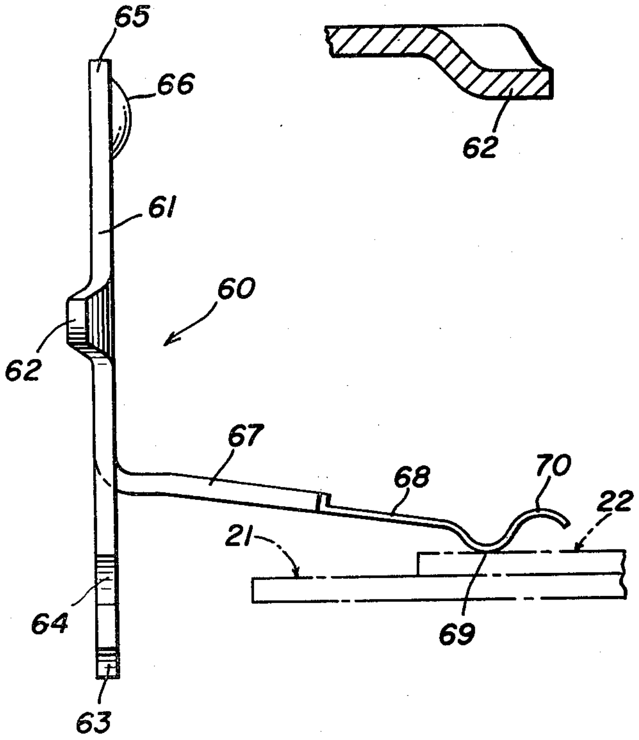
FIG. 7 is a side elevation view of the contact, a portion of the transducer being shown in phantom.
FIG. 8 is an enlarged sectional view taken along the line 8—8 of FIG. 6.

Turning to FIGS. 6 and 7, the details of construction of one of the contacts 60 will be described. The other contacts 60*a* and 60*b* are identical. The contact 60 is formed from a strip of sheet metal bent as shown. The contact 60 includes a body 61 the side edges of which have been deformed to provide dimples 62. A pair of legs 63 extends outwardly from one end of the body 61 which legs respectively carry outwardly directed barbs 64. An ear 65 is carried by the other end of the body 61, the ear 65 having a dimple 66. The ear 65, the legs 63 and the body 61 are coplanar. The portion of the strip between the legs 63 is bent to define a platelike arm 67 in turn carrying bifurcated fingers 68. The outer end of each finger 68 is bent in one direction to form a C-shaped engagement portion 69 and bent in the other direction to form a C-shaped tip 70. The C shape of the tip 70 is to minimize clumping or clinging together of the contacts 60 when in a batch. The fingers 68, the portion 69 and the tip 70 may be silver plated to improve corrosion resistance. The balance of the contact 60 may be tin plated.

Figure 9:
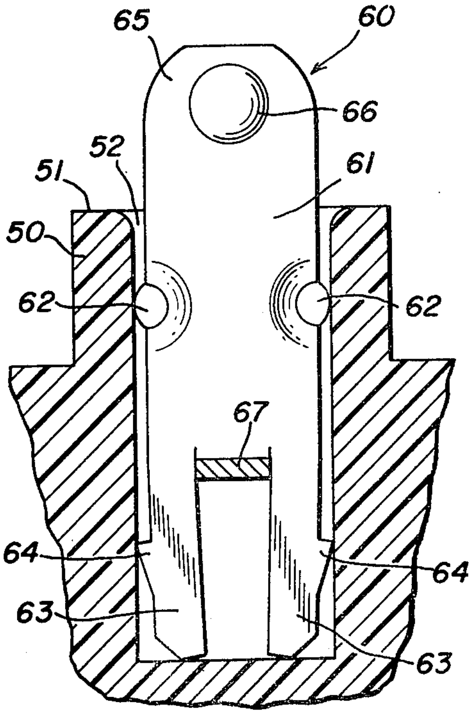
FIG. 9 is an elevation view of the contact mounted in its associated channel in one of the shoulders of the housing.
Figure 10:
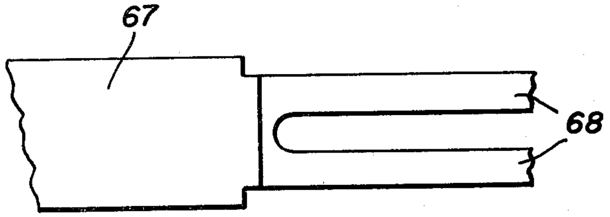
FIG. 10 is an enlarged view of the juncture of the bifurcated fingers and the arm carrying same.
Figure 11:
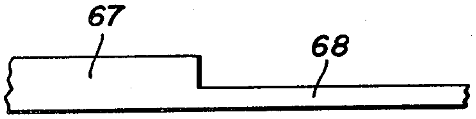
FIG. 11 is an elevational view of the juncture shown in FIG. 10.

Ignoring the dimple 62 and the barbs 64, the contact 60 has a width slightly less than the width of the channel 52, as is best seen in FIG. 9. However, the distance between the outer surfaces of the dimples 62 and the distance between the tips of the bars 64 exceed the width of the channel 52. The contact 60 is mounted by forcibly pushing the body 61 and associated legs 63 into the channel 52. The legs 63 are thereby moved toward one another to enable the barb 64 to clear the sides of the channel 53 so that continued force can be exerted on the contact 60. The dimples 62 will then engage the side walls of the channel 52. A final push will seat the ends of the legs 63 on the bottom wall of the channel 53. The legs 63 being biased outwardly will cause the tips of the barbs 64 to grip tightly the sides of the channel 53 which will effectively prevent retrograde movement of the contact 60. The further contact of the dimples 62 with the side wall of the channel 53 provides for an even more secure fit. The combination of the dimple 62 and the barbs 64 ensure that the contacts will not loosen with use.

When the contact 60 is inserted, the arm 67 will protrude through the notch 54 into the interior of the housing 40 and will either rest on the stop surface 55 or be spaced slightly therefrom. The lengths of the arm 67 and the fingers 68 are such that the engagement portion 69 will engage the electrode 26, as shown in FIG. 2. The contact 60 is resilient so that the engagement portion 69 is biased toward the transducer 21. Thus, the portion 69 springingly engages the electrode 26 on the transducer 21. In a similar fashion, the contact 60*a* springingly engages the electrode 27. Also, the contact 60*b* springingly engages the substrate 23 which is electrically and mechanically connected to the electrode 25 on the transducer 21.

The printed circuit board 30 has three slits which respectively align with the ears of the three contacts, 60, 60*a* and 60*b*. For example, the ear 65 is aligned with the slit 33. The dimple 66 causes the overall width of the ear 65 to be slightly greater than the width of the slit 33. With some slight exertion, the printed circuit board 30 can be snapped into place to rest on the surfaces 51, 51*a* and 51*b* of the respective shoulders. The dimples 66 insure that the printed circuit board will stay in position until solder is later applied. With the solder 71 applied, permanent electrical and mechanical connection of the circuit board 30 is attained.

Since the piezoelectric transducer vibrates in use, any restraints on such vibrations will reduce efficiency. Thus, it is important to minimize such restraints, as for example, produced by connections to the transducer 21. On the one hand, the thinner the contact 60, the less vibrational damping it causes on the transducer 21 and the less the effect is on its efficiency. On the other hand, if the contact 21 is too thin, it will not exert enough force to maintain good electrical contact. It was found that these two criteria could best be satisfied by using relatively thin bifurcated fingers 68 and a thicker arm 67 to carry the fingers.

A thickness of 0.007 inches for each finger 68 and a thickness of 0.018 for the arm 67 produced a strong contact on the one hand, yet one which did not affect significantly the characteristics of the transducer 21. With fingers of that thickness, the contact 60 acts like a spring instead of a beam. In other words, it does not exert excessive force. In fabricating the contact 60, the fingers 68 can be formed by milling material from the arm 67.

It may be seen that the contacts 60, 60*a* and 60*b* provide an electrical connection between the circuit elements on the printed circuit board 30 and the piezoelectric transducer 21. The electrical connection to the transducer 21 is achieved without solder, thereby making the transducer 21 less expensive to produce and precluding damage to the electrodes 25, 26 and 27 which often results from the heat of a soldering iron. Also, without the use of solder, the effect of the connection on the characteristics of the transducer 21 is reduced. The fingers 68 being much thinner than the arm 67 assists in minimizing the effect on the transducer characteristics. The wall 41 extends beyond the transducer 21 to protect the same. The printed circuit board 30 rests upon the shoulders 50, 50*a* and 50*b* to provide a self-contained, compact arrangement. The contacts 60, 60*a* and 60*b* are readily mounted in the housing 40 by simply pushing them in place. The frictional engagement provides secure connection with a minimum of time and effort. Finally, the ear on each of these contacts enables both electrical and mechanical connection to the circuit on the printed circuit board 30.

We claim:

1. An integral contact for providing electrical connection between a circuit and a circuit element mounted in a housing, said contact comprising a flat elongated body, an ear on said body at one end thereof for electrical and mechanical connection to the circuit, a pair of spaced-apart legs on said body substantially coplanar therewith at the end thereof opposite said ear mountable in the housing, an arm extending laterally from said body at an oblique angle thereto between said ear and said legs, and bifurcated fingers carried by said arm for springingly electrically engaging the circuit element.

2. The contact of claim 1, wherein a substantially flat elongated strip of metal provides said body and said ear and said legs and said arm and said fingers.

3. The contact of claim 1, wherein said arm has a thickness substantially greater than the thickness of said fingers.

4. The contact of claim 1, wherein each of said fingers has a C-shaped engagement portion adjacent its end, and a C-shaped tip which is directed oppositely to said C-shaped engagement portion, the mid-part of said C-shaped portion being adapted to engage the circuit element.

5. The contact of claim 1, wherein said legs are biased away from each other.

6. The contact of claim 1, wherein said ear and said legs are disposed substantially in longitudinal alignment with said elongated body, said fingers being spaced from said body.

7. The combination for use with a circuit and a circuit element, comprising a housing for the circuit and the circuit element, an integral contact including a flat elongated body, an ear on said body at one end thereof, a pair of spaced-apart legs on said body substantially coplanar therewith at the other end thereof, said legs being mounted in said housing, said ear being disposed for electrical and mechanical connection to the circuit, an arm extending laterally from said body at an oblique angle thereto between said ear and said legs, and bifurcated fingers carried by said arm, said bifurcated fingers being adapted for springingly electrically engaging the circuit element.

8. The combination of claim 7, wherein said housing includes a channel that frictionally receives said body and said legs.

9. The combination of claim 7, wherein said housing includes a ledge for supporting the circuit element, said fingers being biased toward said ledge.

10. The combination of claim 7, wherein said housing includes a ledge for supporting the circuit element, and an outer wall encircling said ledge and extending well beyond said ledge in order to contain and provide protection for the circuit element.

11. The combination of claim 7, wherein a substantially flat elongated strip of metal provides said body and said ear, said housing including a substantially rectangular channel that frictionally receives said body and said legs.

12. The combination of claim 11, and further comprising a pair of barbs respectively on the outer sides of said legs for improving the retention of said legs by said housing.

13. The combination of claim 12, and further comprising a pair of dimples respectively on the sides of said body intermediate said barbs and said ear for improving the retention of said body by said housing.

14. The combination for use with a circuit and a circuit element, comprising a housing for the circuit and the circuit element, said housing having a channel therein and a notch adjacent to said channel, an integral contact including an elongated body, an ear on said body adjacent to one end thereof, a pair of spaced-apart legs on said body adjacent to the other end thereof, said body and said legs being frictionally received in said channel, said ear being disposed for electrical and mechanical connection to the circuit, an arm extending laterally from said body at an oblique angle thereto and disposed in said notch, and bifurcated fingers carried by said arm, said bifurcated fingers being adapted for springingly engaging the circuit element.

15. The combination for use with a circuit and a circuit element, comprising a housing for the circuit and the circuit element, said housing including a shoulder having a channel therein, said shoulder supporting the circuit, an integral contact including an elongated body frictionally received in said channel, an ear on said body adjacent to one end thereof extending through said circuit and being electrically and mechanically connected thereto, a pair of spaced-apart legs on said body adjacent to the other end thereof, said legs being mounted in said housing, an arm extending laterally from said body at an oblique angle thereto, and bifurcated fingers carried by said arm, said bifurcated fingers being adapted for springingly engaging the circuit element.

* * * * *